United States Patent [19]
Dibble et al.

[11] Patent Number: 5,952,716
[45] Date of Patent: Sep. 14, 1999

[54] PIN ATTACH STRUCTURE FOR AN ELECTRONIC PACKAGE

[75] Inventors: Eric P. Dibble, Endicott; Eric H. Laine, Binghamton; Stephen W. MacQuarrie, Vestal, all of N.Y.

[73] Assignee: International Business Machines Corporation, Armonk, N.Y.

[21] Appl. No.: 08/842,859

[22] Filed: Apr. 16, 1997

[51] Int. Cl.$^6$ .................................................. H01L 23/532
[52] U.S. Cl. .......................... 257/697; 257/774; 257/766; 257/741
[58] Field of Search .................................. 257/773–776, 257/766, 762, 750, 741, 697–692, 786

[56] References Cited

U.S. PATENT DOCUMENTS

| | | |
|---|---|---|
| 4,421,368 | 12/1983 | Saban . |
| 4,446,477 | 5/1984 | Currie et al. . |
| 4,618,739 | 10/1986 | Theobald . |
| 4,620,215 | 10/1986 | Lee . |
| 4,677,526 | 6/1987 | Muehling . |
| 4,688,152 | 8/1987 | Chia . |
| 4,742,024 | 5/1988 | Sugimoto et al. . |
| 4,791,075 | 12/1988 | Lin . |
| 4,816,426 | 3/1989 | Bridges et al. . |
| 4,822,550 | 4/1989 | Komathu . |
| 4,916,522 | 4/1990 | Cohn . |
| 5,006,922 | 4/1991 | McShane et al. . |
| 5,054,192 | 10/1991 | Cray et al. . |
| 5,073,118 | 12/1991 | Grabbe et al. . |
| 5,093,282 | 3/1992 | Ohno et al. . |
| 5,102,829 | 4/1992 | Cohn . |
| 5,195,237 | 3/1993 | Cray et al. . |
| 5,243,757 | 9/1993 | Grabbe et al. . |
| 5,288,944 | 2/1994 | Bronson et al. . |
| 5,456,608 | 10/1995 | Rogers et al. ........................ 439/48 |
| 5,537,672 | 7/1996 | Newman . |
| 5,629,564 | 5/1997 | Nye, III et al. ..................... 257/763 |

FOREIGN PATENT DOCUMENTS

| | | |
|---|---|---|
| 56-27730 | 9/1981 | Japan . |
| 57-141934 | 9/1982 | Japan . |
| 2-143433 | 6/1990 | Japan . |

OTHER PUBLICATIONS

Emerick, et al., "Pin Insertion into Pin Grid Arrays—Concepts, Equipment and Applications;" *Proc. 1991 IEEE Southern Tier Technical Conference*; Oct. 25, 1991; Binhamton, N.Y.; pp. 207–218.

Tummala et al.; "Microelectronics Packaging Handbook;" pp. 463, 782–787.

Cohn et al.; "Plastic Pin Grid Array Packages—the AT&T Experience;" Proc. Int'l Electronics Packaging Society, 1990; pp. 882–893.

"Alcoa Eyes Packaging Fates as Intel Embraces Plastic to replace ceramic pkg for the Pentium Processor with plastic replacement;" *Electronic News*; Jan. 1, 1996; p. 1.

(List continued on next page.)

*Primary Examiner*—David B. Hardy
*Attorney, Agent, or Firm*—Ratner & Prestia; John R. Pivnichny

[57] ABSTRACT

A pinning process including the steps of gold-plating through-holes in a laminate carrier and crimping a gold or gold-plated pin located in the through-holes to form a pin head on the top and a pin bulge on the bottom of the laminate carrier to produce a plastic pin grid array. A variety of mechanical forming processes may be employed to form the pin heads and pin bulges and cause the pin to at least partially, and preferably substantially, fill and contact the gold-plated through-hole including swage pinning, impact pinning, and double-die pinning operations. By combining the steps of gold-plating through-holes of a laminate carrier and using a mechanical pinning process to crimp a gold or gold-plated pin in the through-holes, a reliable mechanical and electrical connection may be established between the pin and the metal lines both inside and on the surface of the laminate carrier without the need for lead-containing solders and pastes.

11 Claims, 8 Drawing Sheets

OTHER PUBLICATIONS

Seraphim et al., "Principles of Electronic Packaging;" McGraw Hill: 1989, pp. 52–54 and 340–347, ©1989.

IBM Technical Brochure, No. SP1383 WPP–01 "Developments in Laminate Carrier Packaging," ©1995.

J. Knight et al., "Reliability Data for the IBM PBGA and PPGA Chip Carriers," 3 pp., 1995.

Electronic Engineering Times/Product File, pp. 1, 19, Oct. 21, 1996.

EDN Products Edition, SCI–1022, pp. 30, 43 Oct. 16, 1996.

Electronic Engineering Times, p. 82; Mar. 17, 1997.

IBM Technical Disclosure No. 744149M, pp. 1 and 6, Aug. 4, 1995.

IBM Technical Disclosure, "µLaminate™ Plastic Ball Grid Array (PBGA)," ©1996.

Advertisement for Interconnect Systems, Inc. titled, "Need a BGA Adapter? ISI Has Solutions.".

IBM Technical Disclosure, "Flexible Alternatives in Packaging Technology," No. PCMHPCSFU–01, ©1994.

PIN ATTACH STRUCTURE FOR AN ELECTRONIC PACKAGE

FIELD OF THE INVENTION

This invention relates generally to a plastic pin grid array (PPGA) and to a process for its fabrication.

BACKGROUND OF THE INVENTION

Ceramic carriers, especially metallized ceramic (MC) carriers have been produced in large quantities and used to package integrated circuit (IC) devices. Through-hole pinning of these ceramic carriers has typically been employed to provide interconnection between the packaged IC device and the next level package.

Disclosed in the technical article by Emerick et al. titled, "Pin Insertion Into Pin Grid Arrays-Concepts, Equipment and Applications," Proc. 1991 IEEE Southern Tier Technical Conference, Oct. 25, 1991, is an MC pinning process in which a gold pin is crimped in a through-hole located in an MC carrier to provide a reliable mechanical and electrical connection between the pin and the MC carrier. Emerick et al. disclose that the manufacture of a substrate begins with a raw ceramic, which forms the backbone of the substrate. Typically the ceramic is made of an alumina composition, with the basic size and through-holes pressed and fired to final dimensions.

The metallization of the fired ceramic is accomplished by sputtering or evaporating three layers of metal, namely, a thin layer of chrome, a thicker layer of copper, and a thin layer of top chrome. The combined thickness of all three layers of metallization is approximately 7.63 microns (0.0003 inches). The metallization is photo-resist coated, exposed, developed, and etched to form a circuit pattern. Basically, all circuit lines extend from a pad in the chip site to a "donut" around each pin hole. The etch process removes the top chrome to expose copper around the pin and thus provides a solderable surface that becomes the land-to-pin connection. Once the circuitry is complete and the substrates are tested and inspected, they are then pinned by placing a pin in each hole and affixing them mechanically to the ceramic.

Figure 1:
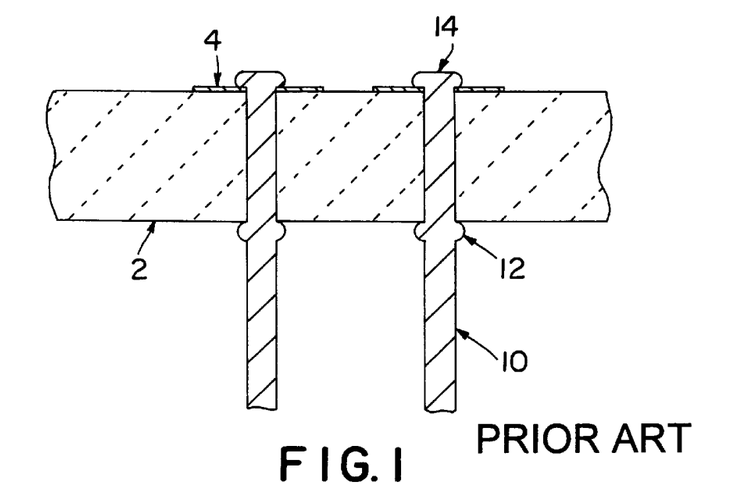
FIG. 1 is cross-sectional view of a conventional CPGA.

Shown in FIG. 1 is the final configuration that results from a conventional MC pinning process which mechanically forms a pin 10 having a pin head 14 on the circuitry side of a ceramic substrate 2 and a pin bulge 12 formed on the opposite side of ceramic substrate 2. The pins 10 connect to metal conductors 4 on the circuitry side of ceramic substrate 2 and extend out from the opposite side of ceramic substrate 2 to provide interconnection with the next board packaging level. Pins 10 may be copper or gold-plated copper depending on whether the module is designed to be plugged or soldered into the next level board.

U.S. Pat. No. 5,006,922, issued to McShane et al., discloses a ceramic pin grid array (CPGA) for packaging semiconductor devices having a single-layer ceramic base with a plurality of through-holes which are coated by an electrically conductive material such as gold, copper, silver, and their alloys. The coated through-holes are formed by applying a vacuum to the through-holes while screen printing the electrically conductive metal onto the base. Input/output pins are mechanically attached to the ceramic base by inserting and swaging the pins into the metal-lined through-holes. The swaging process mechanically forms a pin head on one side of the base and a pin bulge on the opposite side to lock the pins in place. The pins employed preferably are made of alloys of zirconium and copper plated with nickel and gold. Alternatively, McShane et al. discloses that the pins may be manufactured using other materials such as nickel- and gold-plated alloys of nickel-iron-cobalt (i.e., Kovar® alloy) or nickel-iron.

IC devices packaged using ceramic technology such as those disclosed by Emerick et al. and McShane et al. above suffer, however, from the inherent drawback that the ceramic carriers employed are susceptible to breakage during the pinning processes. Moreover, IC packages which incorporate ceramic technology are also very expensive. In order to lower packaging costs, plastic packages have been developed as an alternative to the multilayer CPGA. Plastic packages provide several important advantages for the chip operation as compared with ceramic packages, namely, higher current carrying capacity, a lower dielectric constant for shorter operational delay times, along with reduced inductance and capacitance. These plastic packages, known as plastic pin grid arrays (PPGA), provide a reliable, lower-cost packaging alternative to ceramics. These plastic packages typically employ through-hole pinning techniques, however, which incorporate lead-containing solder or pastes to mechanically secure the pins in place and to establish the required electrical connection. U.S. Pat. No. 5,102,829, issued to Cohn, discloses a process for producing a PPGA package having an encapsulated device and a heat sink forming a unitary laminate component. The PPGA includes a plurality of plated through-holes (PTHs) formed in the laminate which have a copper coating on the walls of the holes. Terminal pins made of Kovar® Ni—Fe—Co alloy or phosphor bronze are then press-fitted into the PTHs and solder-dipped to secure the pins in the holes.

The present invention overcomes the limitations, difficulties, and shortcomings of the prior art by providing a process of producing a PPGA and the product produced thereby having a gold-to-gold interconnection of pins to plated through-holes located in a laminate carrier. As a result, the present invention eliminates the need for pinning processes which incorporate lead-containing solders and pastes for attaching the pins.

SUMMARY OF THE INVENTION

The pinning process according to the present invention includes the steps of gold-plating through-holes in a laminate carrier and crimping a gold or gold-plated pin located in the through-holes to form a pin head on the top of and a pin bulge on the bottom of the laminate carrier to produce a PPGA. A variety of mechanical forming processes may be employed to form the pin heads and pin bulges and to cause the pin to fill and contact the gold-plated through-hole. Exemplary forming operations which may be used to perform the pinning operation may include, but are not limited to, swage pinning, impact pinning, and double-die pinning processes. By combining the steps of gold-plating through-holes of a laminate carrier and using a mechanical pinning process to crimp a gold or gold-plated pin in the through-holes, a reliable mechanical and electrical connection may be established between the pin and metal lines located both inside and on the surface of the laminate carrier without the need for lead-containing solders and pastes.

BRIEF DESCRIPTION OF THE DRAWING

The invention is best understood from the following detailed description when read in connection with the accompanying drawing, in which.

DETAILED DESCRIPTION OF THE INVENTION

The present invention provides a process for producing a PPGA and the product produced thereby having a gold-to-gold interconnection of gold or gold-plated pins to gold-plated through-holes located in a laminate carrier. It is emphasized that, pursuant to common practice, the various dimensions of the PPGA and the component parts incorporated therein according to the present invention as shown in the drawing are not necessarily to scale. To the contrary, the various dimensions shown may be arbitrarily expanded or reduced for clarity.

I. Laminate Carriers Having Gold-Plated Through-Holes

Figure 2A:
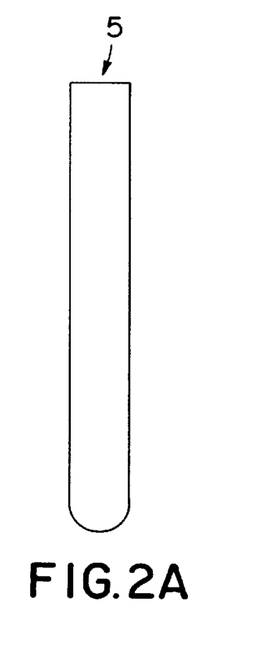
FIG. 2A is a cross-sectional view of a gold pin blank according to an embodiment of the present invention.
Figure 2B:
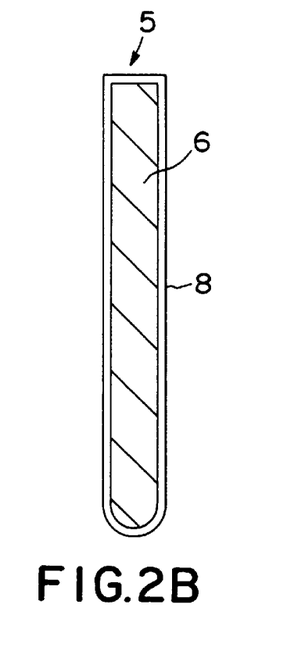
FIG. 2B is a cross-sectional view of a gold-plated pin blank according to an alternative embodiment of the present invention.
Figure 2C:
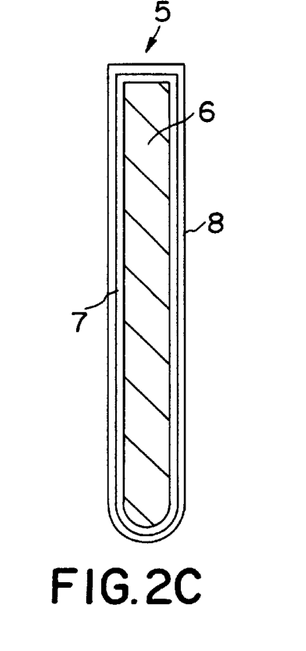
FIG. 2C is a cross-sectional view of a gold-plated pin blank having an intermediate plating layer according to an alternative embodiment of the present invention.
Figure 3A:
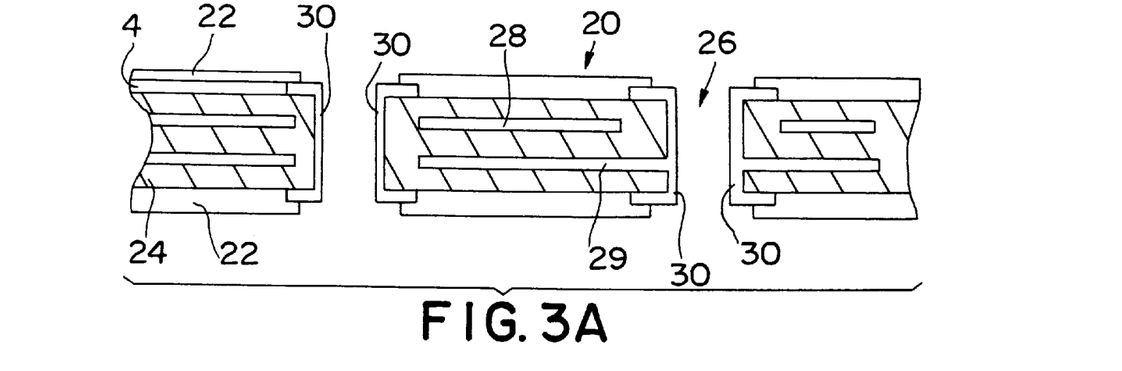
FIG. 3A is a cross-sectional view of a laminate carrier having gold-plated through-holes according to an embodiment of the present invention.
Figure 3B:
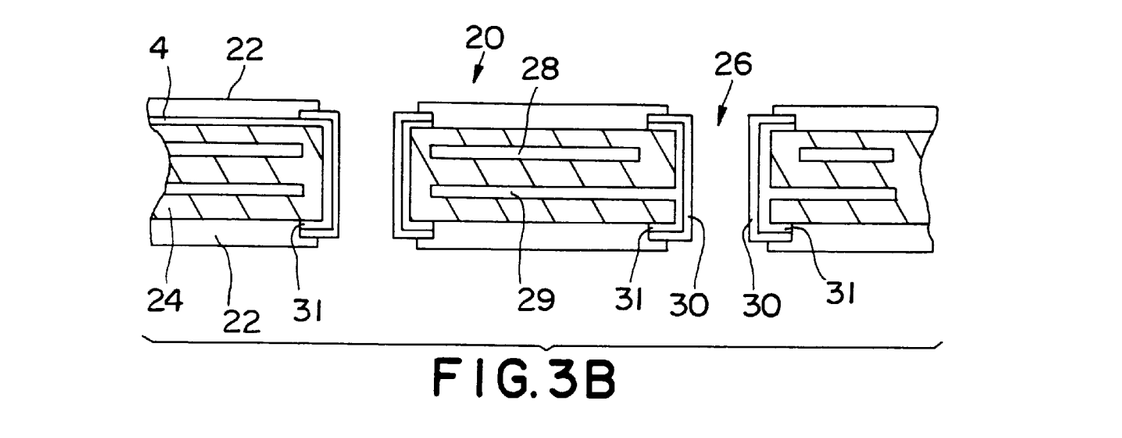
FIG. 3B is a cross-sectional view of a laminate carrier having gold-plated through-holes according to an alternative embodiment of the present invention.
Figure 3C:
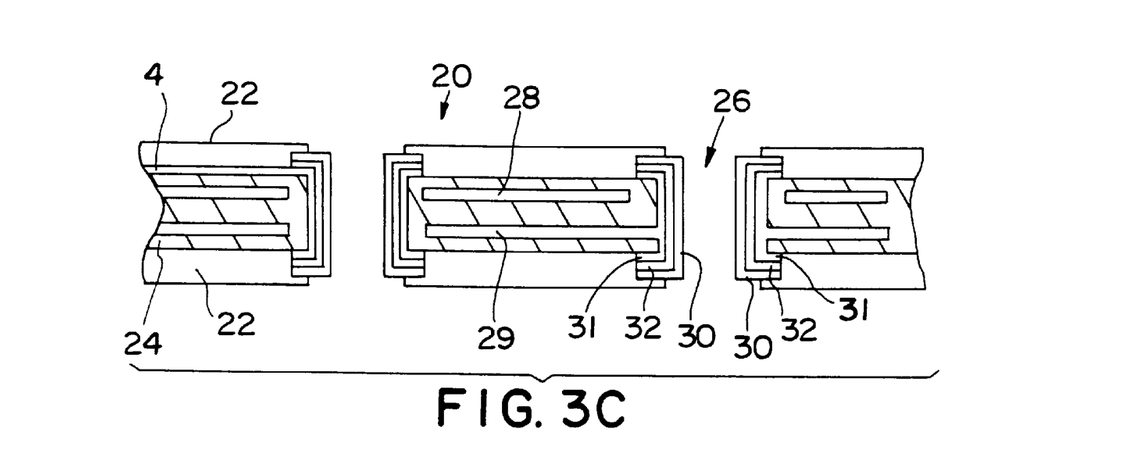
FIG. 3C is a cross-sectional view of a laminate carrier having gold-plated through-holes according to an alternative embodiment of the present invention.
Figure 3D:
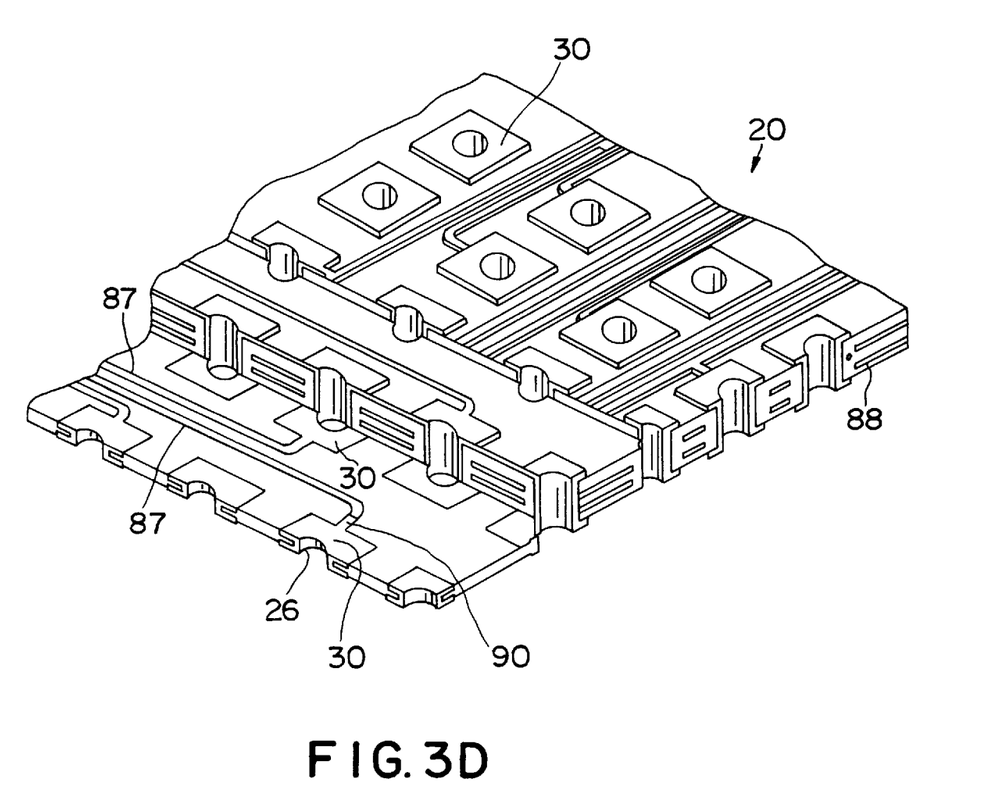
FIG. 3D is a planar sectional view of a laminate carrier having gold-plated through-holes according to an alternative embodiment of the present invention.
Figure 3E:
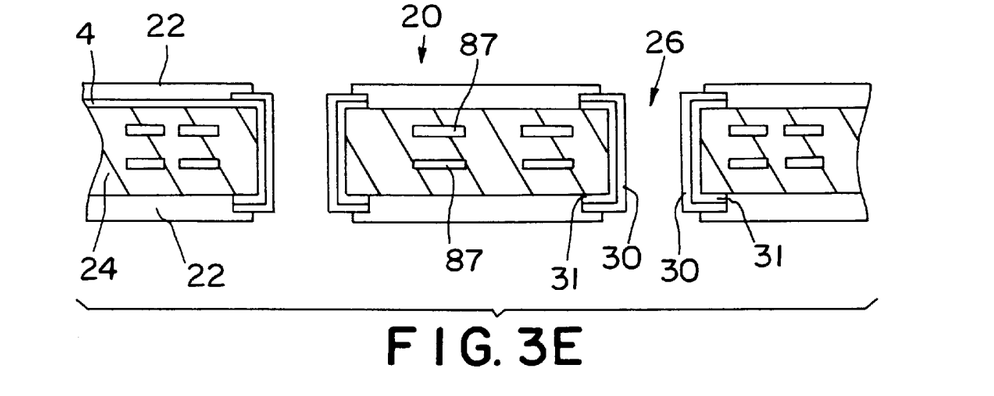
FIG. 3E is a cross-sectional view of a laminate carrier having gold-plated through-holes according to an alternative embodiment of the present invention.
Figure 3F:
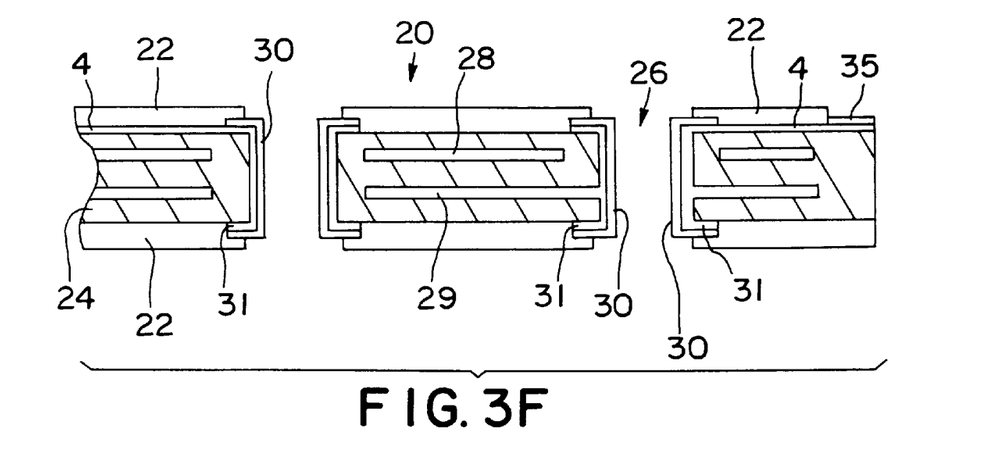
FIG. 3F is a cross-sectional view of a laminate carrier having gold-plated through-holes according to an alternative embodiment of the present invention.
Figure 4A:
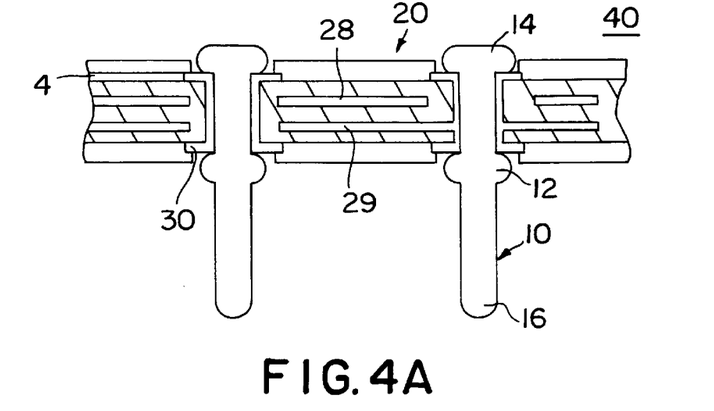
FIG. 4A is a partial cross-sectional view of an assembled PPGA produced according to the process of the present invention using the laminate carrier of FIG. 3A.
Figure 4B:
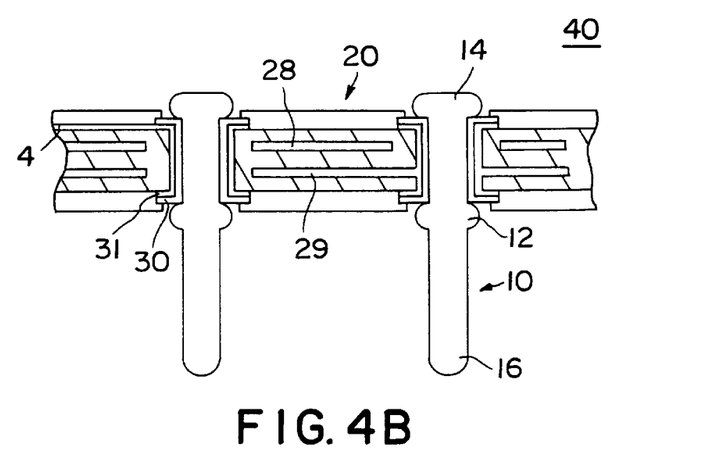
FIG. 4B is a partial cross-sectional view of an assembled PPGA produced according to the process of the present invention using the laminate carrier of FIG. 3B.
Figure 4C:
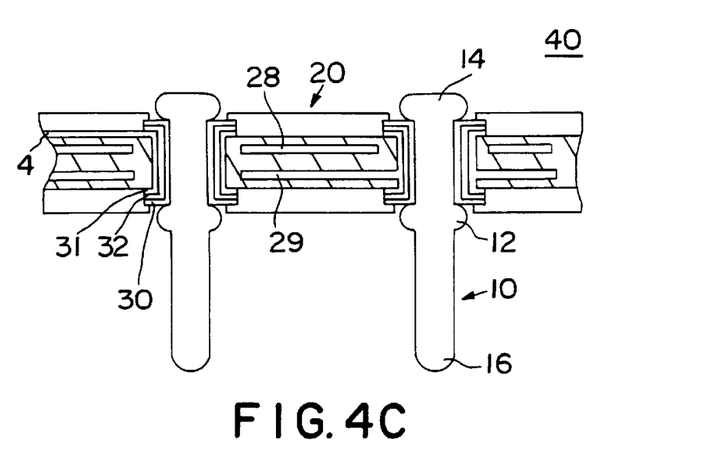
FIG. 4C is a partial cross-sectional view of an assembled PPGA produced according to the process of the present invention using the laminate carrier of FIG. 3C, FIGS. 5A–5D are partial cross-sectional views illustrating the steps, of swage pinning a gold-plated through-hole of a laminate carrier according to a process of the present invention.

Referring now to the drawing, wherein like reference numerals refer to like elements throughout, FIGS. 3A, 3B, and 3C show laminate carriers 20 which typically have a layer approximately 1.54 mm (0.060 inches) thick of a dielectric material 24 and are used to produce the PPGAs shown in FIGS. 4A, 4B, and 4C, respectively, according to the present invention. Laminate carriers 20 are provided with a plurality of through-holes 26 which are transversely located for receiving pin blanks 5 such as those shown in FIGS. 2A, 2B, and 2C. According to the process of the present invention, as shown in FIG. 3A the surface of through-holes 26 are gold-plated with gold-plating layer 30 for interconnecting various conductor levels of laminate carrier 20. As shown in FIGS. 3A, 3B, 3C, 3E, and 3F, gold-plating layer 30 may extend from the inner surface of through-holes 26 to areas on the top and bottom surfaces of laminate carrier 20 surrounding through-holes 26. As shown in FIG. 3F, gold-plating layer 30 may be further extended to provide a wire bond pad 35.

As shown in FIGS. 3B and 3C, gold-plated through-holes 26 may also be produced by first providing conventional copper-plated through-holes (PTHs) by depositing copper-plating layer 31 by any conventional process as is known in the art. Subsequent plating processes may then be performed to plate the copper-plating layer 31 directly with gold-plating layer 30 as shown in FIG. 3B or with an additional intermediate plating layer 32 preferably of nickel disposed between the copper-plating layer 31 and gold-plating layer 30 as shown in FIG. 3C. The nickel- and gold-plating layers may be deposited using conventional plating processes and preferably are plated during the formation of the wire bond pads 35, if provided, as discussed below and shown in FIG. 3F as is known in the art.

A metal conductor 4, preferably a 0.038 mm (0.0015 inches) thick metallization layer of copper, is provided on the outer surface of dielectric material 24 which extends toward the center of laminate carrier 20 for connection with at least one wire bond pad of a die of an electronic assembly (not shown). Electrical contact between metal conductor 4 and gold-plating layer 30 may be established either directly, by abutting these components as shown in FIG. 3A, or indirectly, by extending copper-plating layer 31 to form metal conductor 4 as shown in FIGS. 3B and 3C. An organic solder mask 22, which is typically a 0.026 mm to 0.051 mm (0.001 inch to 0.002 inch) thick polymer cover coat, is selectively applied to the outer surface of metal conductor 4 and laminate carrier 20 where subsequent nickel- and gold-plating to connect the exposed copper metallization areas is not required. The remaining exposed portion of metal conductor 4 may be electroplated with nickel and gold to form wire bond pad 35 shown in FIG. 3F which may be used for subsequent bonding to wire conductors. Alternatively, the organic solder mask 22 may be formed by applying a film of a polymer cover coat to the entire outer surface of metal conductor 4 and laminate carrier 20 and selectively removing the polymer cover coat where subsequent nickel- and gold-plating to connect the exposed copper metallization areas is required. Alternatively, electroplating with nickel and gold may be performed before the application of organic solder mask 22.

Optionally, metal planes 28 and 29 may also be provided in dielectric material 24 for interconnecting various conductor levels of laminate carrier 20. The metal planes are electrically separated by dielectric material 24. As shown in FIG. 3D, the metal planes embedded in laminate carrier 20 may be provided as a signal plane 87 or as a voltage plane 88, preferably of copper, for establishing voltage levels for circuits. FIG. 3E is similar to the laminate carrier of FIG. 3D and shows a variation to FIGS. 3A, 3B, 3C, with signal planes 87 provided in dielectric material 24. Signal plane 87 and voltage plane 88 may also be provided with both being placed in dielectric material 24. As shown in FIGS. 3A, 3B, 3C and 3F, interconnections with the metal planes may be accomplished by electrically contacting metal planes 29 to plated through-holes 26. FIG. 3D shows a similar structure for connecting a part of a signal plane 87 to a plated through-hole 26. Gold-plating layer 30 may be extended to form gold-plating extension 90 which partially overlaps signal plane 87 as shown in FIG. 3D. As shown in FIGS. 4A, 4B, and 4C, electrical contact is established between pins 10 inserted into the through-holes of laminate carrier 20 and metal planes 29 which contact the plated through-holes. By selectively arranging the metal planes 29 and metal conductors 4 to contact specific through-holes 26, various combinations of electrical connections and circuits may be established upon crimping pins 10 to establish contact with the gold-plated through-holes 26 as desired. The pinning process according to the present invention will be discussed in greater detail below.

II. Gold and Gold-Plated Pins

The first step of the pinning process includes placing pin blanks 5 shown in FIGS. 2A–2C into the gold-plated through-holes 26 of laminate carrier 20. Pin blank 5 may be solid gold (FIG. 2A) or may comprise a core 6 preferably of copper, which has gold-plating layer 8 (FIG. 2B) and may also contain an intermediate plating layer 7, preferably of nickel (FIG. 2C). The top and mid-portion of pin blank 5 are respectively crimped to form a pin head 14 on one side of laminate carrier 20 and a pin bulge 12 on the opposite side to lock the pins 10, thus produced, in place. FIGS. 4A, 4B, and 4C show PPGAs 40 produced using the respective laminate carriers 20 shown in FIGS. 3A, 3B, and 3C. The distal ends 16 of the pins 10 are configured for insertion into and interconnection with the next level of assembly which can include, for example, a socket on a microprocessor printed circuit board.

III. Exemplary Pinning Processes

A variety of mechanical forming processes may be employed to crimp pin blanks 5 to form pins 10 with the only requirement being that the forming operation must be capable of producing pin bulge 12 and pin head 14 and deforming pin blank 5 to at least partially, and preferably substantially, fill and contact the gold-plated through-hole 26. Exemplary forming operations which may be used to perform the pinning operation of the present invention may include, but are not limited to, swage pinning, impact pinning, and double-die pinning processes. These exemplary pinning processes will be further described below with reference to FIGS. 5A–5D which illustrate a swage pinning operation, and FIGS. 6A–6B which illustrate an impact pinning operation, and FIGS. 7A–7F which illustrate a double-die pinning operation.

A. Swage Pinning Process

Figure 5A:
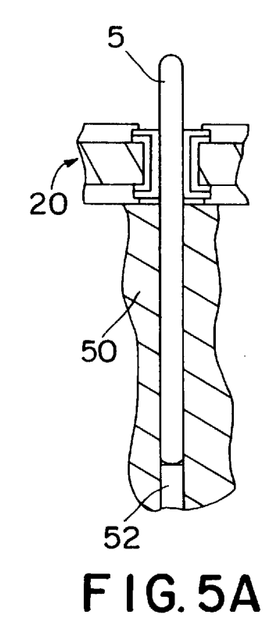
Figure 5B:
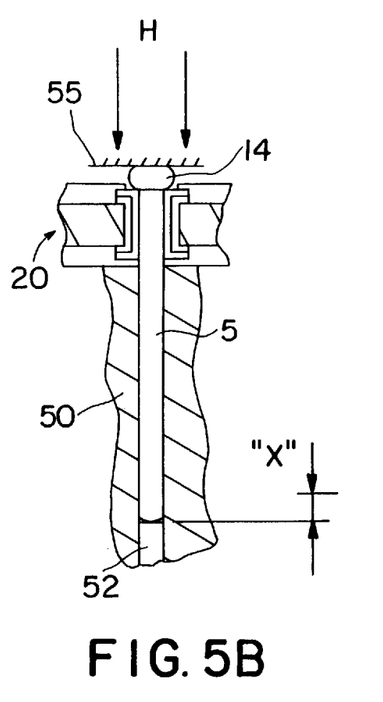
Figure 5C:
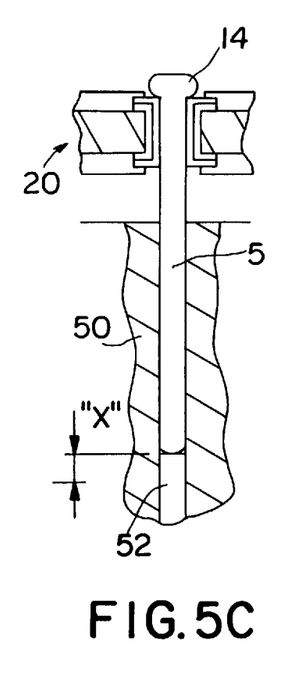
Figure 5D:
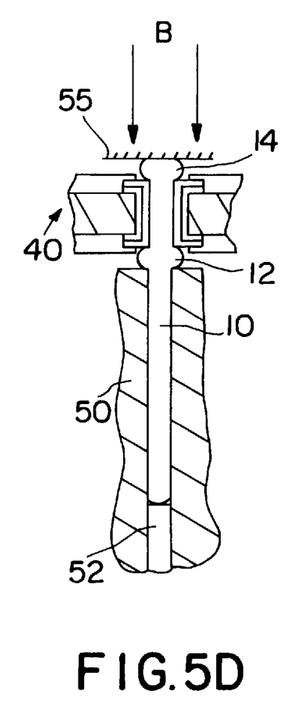

FIGS. 5A–5D shows the sequence of steps for performing a swage pinning operation to produce a PPGA 40 having a laminate carrier 20. Cylindrical pin blanks 5 are placed into a die 50 and supported by quill pins 52 such that a portion of pin blank 5 extends above die 50 as shown in FIG. 5A. The length of pin blank 5 which extends above die 50 is adjusted to provide a volume of material sufficient to form a pin head 14 during the swaging process. The gold-plated through-holes 26 of laminate carrier 20 are aligned with and placed over the exposed end of the pin blanks 5. A flat tool 55 is pressed against the exposed portion of pin blank 5 with sufficient force in the direction designated by the arrows labeled "H" in FIG. 5B to form pin head 14. As shown in FIG. 5C, flat tool 55 is then retracted and quill pin 52 is raised by a distance designated as "X" to lift laminate carrier 20 from the die 50. The laminate carrier 20 is lifted to a height which exposes a portion of pin blank 5 located between the laminate carrier 20 and the surface of die 50 to provide a sufficient volume of material to form pin bulge 12. Flat tool 55 again is pressed toward the laminate carrier 20 with sufficient force in the direction designated by the arrows labeled "B" to form pin bulge 12 and deform pin blank 5 to at least partially, and preferably substantially, fill and contact gold-plated through-hole 26 in laminate carrier 20 thereby producing PPGA 40 having crimped pins 10 as shown in FIG. 5D. Quill pins 52 then eject the finished PPGA 40.

Preferably, the swaging operation described above is performed using carbide dies mounted on a rotary table having automated pin feed, laminate carrier loading, forming and ejection stations, and optimally is used to produce PPGAs smaller than 36 mm (1.4 inches) with a standard 2.56 mm (0.100-inch) grid.

B. Impact Pinning Process

Figure 6A:
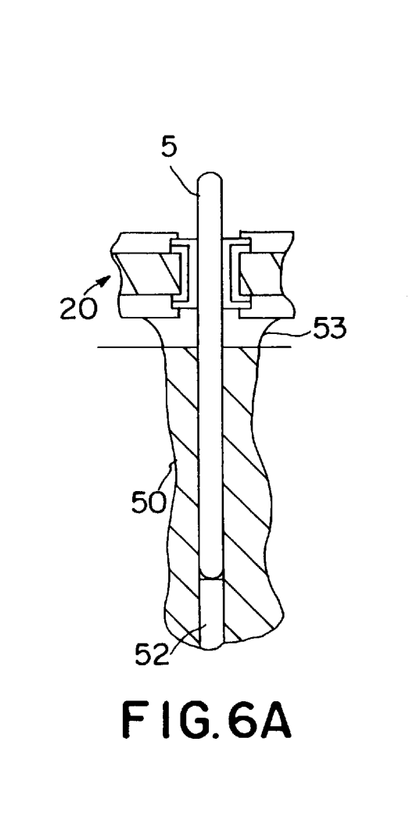
FIGS. 6A–6B are partial cross-sectional views illustrating the steps of impact pinning a gold-plated through-hole of a laminate carrier according to a process of the present invention.
Figure 6B:
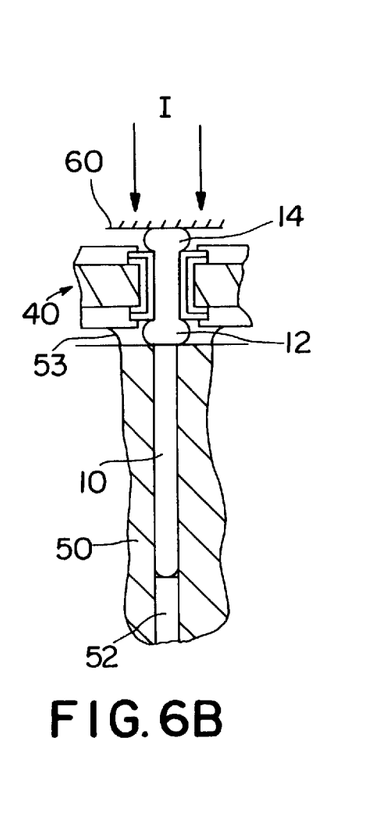

An alternative impact pinning process may also be employed which is particularly useful for pinning larger laminate carriers. As seen in FIG. 6A, a pin blank 5 is placed in a die 50 and supported by quill pin 52. The gold-plated through-holes 26 of laminate carrier 20 are aligned with and placed over the exposed end of pin blank 5. The laminate carrier 20 is held above the surface of die 50 by thin springs 53 which rest around the edges of through-hole 26. The height at which the laminate carrier 20 is placed above the die is adjusted to expose portions of the pin blank 5 above and below the surfaces of the laminate carrier 20 to provide a sufficient volume of material needed to fill the die 50, form pin head 14 and pin bulge 12, and at least partially, and preferably substantially, fill through-holes 26 in laminate carrier 20. A flat impact piston 60 is fired at the exposed pin blank 5 at a high rate of speed sufficient to provide an impact force, designated by the arrows labeled "I" in FIG. 6B, which expands the pin blank 5 in die 50, collapses pin blank 5 to form pin head 14 and pin bulge 12, and deforms pin blank 5 to fill and contact gold-plated through-hole 26 in laminate carrier 20 thereby producing PPGA 40 having crimped pins 10. During this forming action, the laminate carrier 20 is accelerated by the impact "I" and decelerated by the formation of pin bulge 12. Factors such as the dimensions and hardness of pin blank 5, which can influence the dimensions of pin 10 in the finished PPGA 40, may be readily adjusted as will be readily recognized by those having ordinary skill in the art.

C. Double-Die Pinning Process (2-Die System)

Alternatively, a double-die pinning operation may be employed to establish a pin-to-laminate carrier connection which uses a two-die system in which separate dies are used to form the pin head 14 and pin bulge 12 portions on pin blank 5. This process provides for better process control of the laminate carriers 20 and facilitates the making of pin connections with tighter tolerances. A double-die pinning apparatus may be employed such as that disclosed in the technical article by Emerick et al. titled, "Pin Insertion Into Pin Grid Arrays-Concepts, Equipment and Applications," Proc. 1991 IEEE Southern Tier Technical Conference, Oct. 25, 1991, pp. 207–218, which is discussed above and incorporated herein by reference. FIGS. 7A–7F show the sequence of operations which employs the apparatus disclosed by Emerick et al.

Figure 7A:
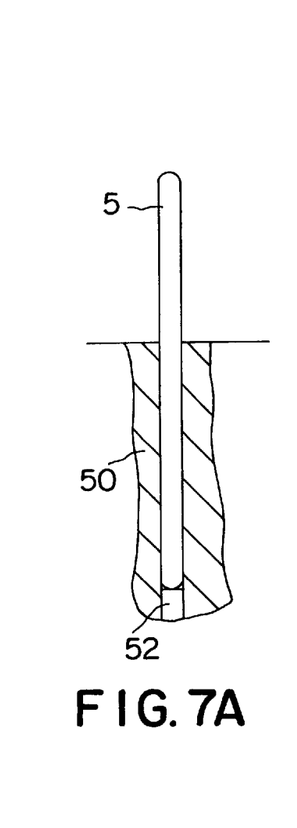
FIGS. 7A–7F are partial cross-sectional views illustrating the steps of using a two-die system for pinning a gold-plated through-hole of a laminate carrier according to a process of the present invention.
Figure 7B:
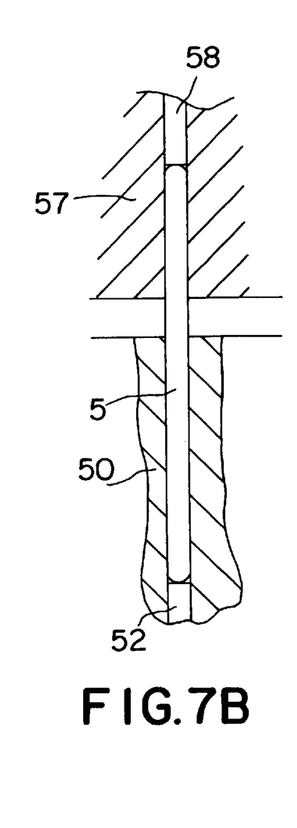
Figure 7C:
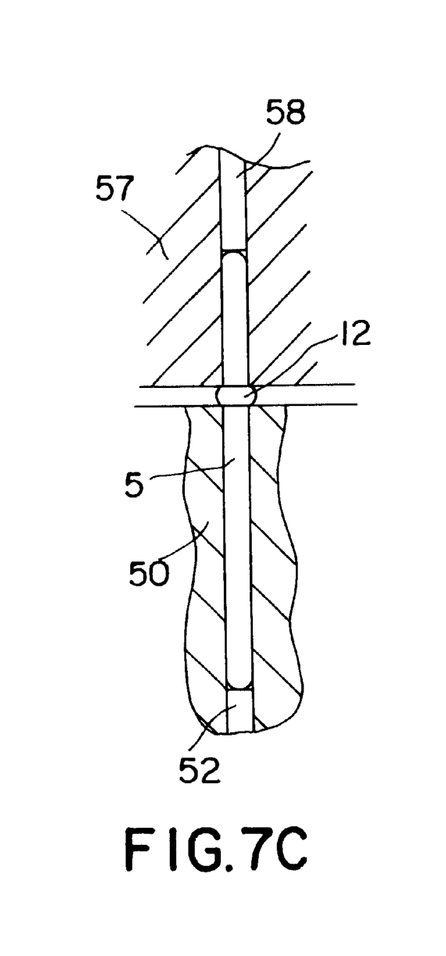

Cylindrical pin blank 5 is placed into die 50 and supported by quill pin 52 such that a portion of pin blank 5 extends above the die 50 as shown in FIG. 7A. The length of the pin blank 5 which extends above the die is adjusted to provide a volume of material sufficient to form pin head 14 and pin bulge 12 during the pinning process. As shown in FIG. 7B, matching die 57 having quill pin 58 is aligned and placed over a portion of pin blank 5 which protrudes from die 50. As shown in FIG. 7C, die 50 and matching die 57 are moved toward one another to form pin bulge 12 on pin blank 5. The dimensions of pin bulge 12 may be varied during this step by controlling the position of quill pin 58 in matching die 57 and controlling the distance moved between die 50 and matching die 57.

Figure 7D:
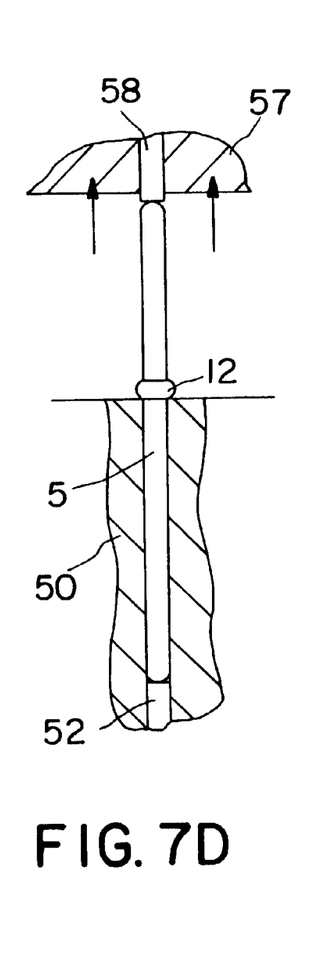
Figure 7E:
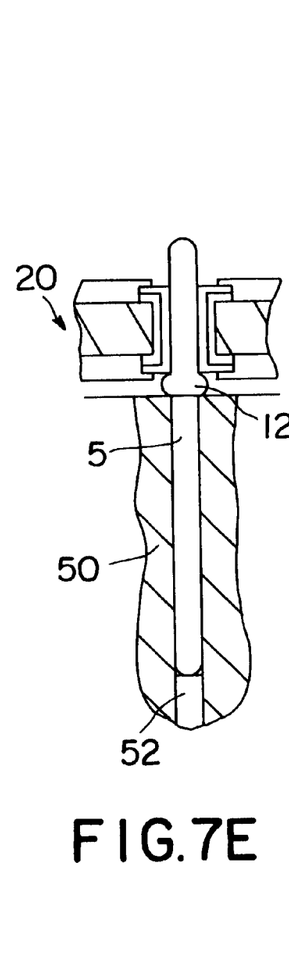
Figure 7F:
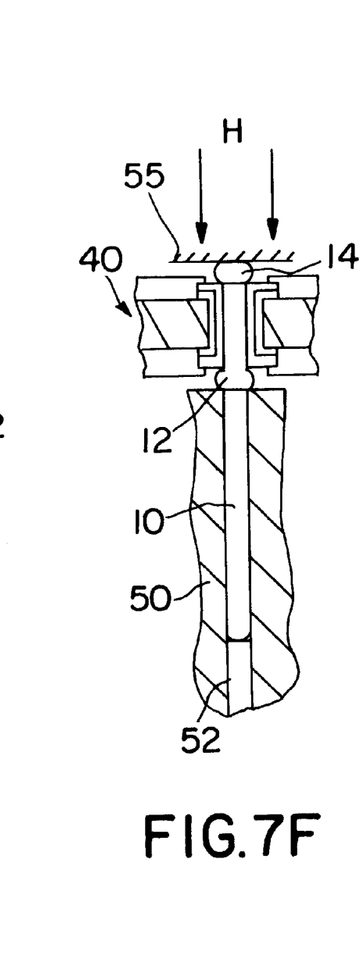

The matching die 57 is then removed as shown in FIG. 7D to leave a predetermined volume of pin blank 5 above pin bulge 12. As shown in FIG. 7E, the gold-plated through-holes 26 of laminate carrier 20 are aligned with and placed over the exposed end of pin blank 5 and seated against pin bulge 12. Flat tool 55 is moved down a specified distance and pressed against the exposed portion of pin blank 5 with sufficient force in the direction designated by the arrows labeled "H" in FIG. 7F to form pin head 14 thereby producing PPGA 40 having crimped pins 10. Quill pins 52 then eject the finished PPGA 40.

By separating the pinning process into discrete steps of forming pin head 14 and pin bulge 12, each step may be precisely controlled to achieve precision pinning results. More specifically, by forming pin bulge 12 between two matched and guided dies, buckling does not easily occur during the production of pin 10. Skewing between the laminate carrier 20 and pin 10 is also reduced because leaning of pin blank 5 during formation of pin head 14 is reduced.

IV. Advantages of the Pinning Process of the Present Invention

Thus, according to the present invention, by combining the steps of gold-plating through-holes of a laminate carrier and using a mechanical pinning process to crimp a gold or gold-plated pin in the through-holes, a reliable mechanical and electrical connection may be established between the pin and the metal lines of the laminate carrier. It is expected that with subsequent thermal cycling which typically occurs when a die, such as a microprocessor, is turned on and off, the gold pinto-laminate gold surface connection will be further enhanced. Thus, the process of the present invention eliminates the need for lead-containing solders and pastes for attaching pins into a laminate carrier to produce PPGAs. As a result, the process of the present invention is cost effective and environmentally sound; it does not require the soldered pin connections or the lead-containing (typically SnPb) materials of the prior art.

V. Variations of the Present Invention

Although the processes described above are illustrated using a single pin placed into a through-hole of a laminate carrier, it is understood that any number of pins may be simultaneously or sequentially pinned into the laminate carrier and in any pinning configuration required for any specific application and that the pinned PPGA laminate carriers may be provided in the form of various devices. Exemplary PPGA devices include, but are not limited to, Ball Grid Array (BGA) interface adapters, programming adapters, Plastic Quad Flat Pack (PQFP) clips, and pinned interposers. Examples of these devices which may be pinned using the method of the present invention include (1) BGA interface adapters such as those manufactured by any of Interconnect Systems Inc., Simi Valley, Calif.; Methode Electronics, Inc., Chicago, Ill.; and Emulation Technology, Santa Clara, Calif., (2) programming adapters and PQFP clips such as those manufactured by Contact Emulation Technology, Inc., Santa Clara, Calif., and (3) pinned interposers or headers such as those shown in IBM Technical Brochure, No. SP1383 WPP-01, titled "Developments in Laminate Carrier Packaging," 1995, at page 11.

It is also understood that, although the various processes are shown in the figures as using specific laminate carrier and pin blank configurations, it is envisioned and to be understood that the various laminate carrier and pin blank configurations of the present invention as shown in the figures are interchangeable and may be incorporated either in place of or in combination with any of the pinning processes disclosed.

It is also understood that, although the description above refers to specific mechanical processes for metallurgically connecting the pins to the laminate carrier, the present invention is not limited to those embodiments which are only exemplary. Rather it will be readily apparent to those of ordinary skill in the art that a variety of mechanical means may be used to form the head and bulge regions of the pins in order to establish the mechanical and electrical connections required. It is envisioned and to be understood that the lists of materials used to plate the through-holes and which comprise the pins of the present invention are also only exemplary and are not meant to exclude other options which will be readily apparent to those of ordinary skill in the art upon reading and as taught by the above disclosure.

Although illustrated and described with reference to certain specific embodiments, the present invention is nevertheless not intended to be limited to the details shown. Rather, various modification may be made in the details within the scope and range of equivalents of the claims and without departing from the spirit of the invention.

What is claimed:

1. A plastic pin grid array comprising a laminate carrier having a top surface and a bottom surface, a centrally disposed dielectric material, and at least one transverse through-hole which defines an inner surface with a corresponding at least one pin inserted therein and having a gold surface, comprising:
   a layer of gold on said inner surface of said at least one through-hole in said laminate carrier wherein said at least one pin electrically contacts said layer of gold disposed on said inner surface, and
   said gold layer extends from said inner surface of said at least one through-hole to areas on said top and bottom surfaces of said laminate carrier surrounding said at least one through-hole.

2. A plastic pin grid array according to claim 1 wherein said at least one pin has a pin head which contacts said top surface of said laminate carrier and a pin bulge which contacts said bottom surface of said laminate carrier.

3. A plastic pin grid array according to claim 1 wherein said pin has a pin head which contacts said gold on said top surface of said laminate carrier and pin bulge which contacts said gold on said bottom surface of said laminate carrier.

4. A plastic pin grid array according to claim 1 further comprising a layer of copper disposed between said inner surface of said at least one through-hole and said layer of gold.

5. A plastic pin grid array according to claim 1 further comprising a layer of copper and a layer of nickel disposed sequentially between said inner surface of said at least one through-hole and said layer of gold.

6. A plastic pin grid array according to claim 15 wherein said at least one pin consists essentially of gold.

7. A plastic pin grid array according to claim 15 wherein said at least one pin comprises a gold surface plated on a core of a material selected from the group consisting of copper and copper plated with nickel.

8. A plastic pin grid array according to claim 1 wherein said laminate carrier further comprises at least one conductor selected from the group consisting of a metal plane disposed in said dielectric material, a metal conductor disposed on said surfaces of said laminate carrier, and combinations thereof, with said at least one conductor being electrically connected to said gold on said inner surface of said at least one through-hole.

9. A plastic pin grid array according to claim 8, wherein said metal plane is selected from the group consisting of a signal plane, a voltage plane, and combinations thereof.

10. A plastic pin grid array according to claim 8, wherein said at least one conductor is a metal conductor disposed on said surfaces of said laminate carrier.

11. A plastic pin grid array produced by the process of producing a plastic pin grid array ("PPGA") comprising a laminate carrier having a top surface and a bottom surface, a centrally disposed dielectric material, and at least one transverse through-hole which defines an inner-surface with a corresponding at least one pin inserted therein and having a gold surface, comprising the steps of:

disposing a layer of gold on said inner surface of said at least one through-hole in said laminate carrier, said gold layer extends from said inner surface of said at least one through-hole to areas on said top and bottom surfaces of said laminate carrier surrounding said at least one through-hole     inserting at least one pin blank having a gold surface into a corresponding at least one of said through-holes,     deforming said at least one pin blank to form at least one pin which contacts said layer of gold disposed on said inner surface of said at least one through-hole,     wherein said PPGA is a device selected from the group consisting of a Ball Grid Array (BGA) interface adapter, a programming adapter, a Plastic Quad Flat Pack (PQFP) clip, and a pinned interposer.

\* \* \* \* \*

UNITED STATES PATENT AND TRADE MARK OFFICE
CERTIFICATE OF CORRECTION

PATENT NO. : 5,952,716
DATED : September 14, 1999
INVENTOR(S) : Eric P. Dibble et al.

It is certified that error appears in the above-identified patent and that said Letters Patent is hereby corrected as shown below:

On the cover page under "Other Publications," in the first reference, delete "Binhamton" and insert —Binghamton—.

In column 8, claim 6, line 62, delete "15" and insert —1—.

In column 8, claim 7, line 64, delete "15" and insert —1—.

Signed and Sealed this

Thirtieth Day of May, 2000

Attest:

Q. TODD DICKINSON

*Attesting Officer*   Director of Patents and Trademarks